(12) United States Patent
Ono

(10) Patent No.: US 6,848,096 B2
(45) Date of Patent: Jan. 25, 2005

(54) APPARATUS FOR CORRECTING DATA OF LAYOUT PATTERN

(75) Inventor: Yusaku Ono, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/424,921

(22) Filed: Apr. 29, 2003

(65) Prior Publication Data

US 2003/0208741 A1 Nov. 6, 2003

(30) Foreign Application Priority Data

May 1, 2002 (JP) .......................................... 2002-129933

(51) Int. Cl.[7] .............................................. G06F 17/50
(52) U.S. Cl. ............................. 716/21; 716/19; 716/20
(58) Field of Search ................................ 716/19–21, 2, 716/18; 430/5, 22, 30, 311

(56) References Cited

U.S. PATENT DOCUMENTS

| | | | |
|---|---|---|---|
| 6,077,310 A | * | 6/2000 | Yamamoto et al. ........... 716/19 |
| 6,425,117 B1 | * | 7/2002 | Pasch et al. .................. 716/21 |
| 6,519,759 B2 | * | 2/2003 | Tounai ......................... 716/19 |
| 2001/0005566 A1 | | 6/2001 | Kotani et al. |
| 2003/0097647 A1 | * | 5/2003 | Pierrat et al. ................. 716/19 |
| 2003/0115569 A1 | * | 6/2003 | Ikeuchi ........................ 716/19 |

FOREIGN PATENT DOCUMENTS

| | | |
|---|---|---|
| JP | 2001-100390 | 4/2001 |
| JP | 2001-188336 | 7/2001 |

OTHER PUBLICATIONS

*Calibre WORKbench and LITHO Commands Reference Manual* v.8.8_11 (Jun. 2001) pp. 3:51–3:52.
"Customizing Proximity Correction for Process–Specific Objectives" Michael L. Rieger, et al. *SPIE* vol. 2726 (1996).

* cited by examiner

*Primary Examiner*—Vuthe Siek
*Assistant Examiner*—Binh Tat
(74) *Attorney, Agent, or Firm*—McDermott Will & Emery LLP

(57) ABSTRACT

An apparatus for correcting layout pattern data composed of a computer system includes eight sections. The first section holds the layout pattern data. The second section holds correcting requirements. The third section extracts and divides correction target edges of the layout pattern. The fourth section sets a permissible correction range. The fifth section extracts insufficient process margin parts. The sixth section resets the permissible correction range. The seventh section performs correction by simulation. The eighth section holds finished correction layout pattern data. By simulation, the apparatus predicts finished layout patterns at high rate and high precision within the movable range of the correction target edges which can secure process margins.

2 Claims, 12 Drawing Sheets

(METALLIC WIRING LAYOUT PATTERN DATA)

(LAYOUT PATTERN DATA AFTER DIVIDING CORRECTION TARGET EDGES)

(LAYOUT PATTERN DATA AFTER PERFORMING SIZING AT THE LOWER LIMIT)

(PREDICTED FINISHED PATTERNS AFTER THE SIMULATION OF PROCESS FLUCTUATIONS)

(EXTRACTING CORRECTION TARGET EDGES WHOSE PROCESS MARGINS ARE INSUFFICIENT)

(LAYOUT PATTERN DATA AFTER PERFORMING SIZING AT THE UPPER LIMIT)

(PREDICTED FINISHED PATTERNS AFTER THE SIMULATION OF PROCESS FLUCTUATIONS)

(EXTRACTING CORRECTION TARGET EDGES WHOSE PROCESS MARGINS ARE INSUFFICIENT)

(CORRECTED LAYOUT PATTERN DATA)

(EXTRACTING CORRECTION TARGET EDGES WHOSE PROCESS MARGINS ARE INSUFFICIENT)

(LAYOUT PATTERN DATA AFTER GENERATING AUXILIARY PATTERNS)

(CORRECTED LAYOUT PATTERN DATA)

APPARATUS FOR CORRECTING DATA OF LAYOUT PATTERN

BACKGROUND OF THE INVENTION

1. Field of the Invention

The present invention relates to an apparatus for correcting data of a layout pattern so as to correct pattern distortion caused during a pattern formation process such as lithography or etching that is used for fabricating semiconductor devices.

2. Description of the Prior Art

At present, in the design rule for semiconductor devices, the minimum value of the pattern dimension has reached the level of 0.13 μm. Therefore, the minimum value of the pattern dimension is shorter than the wavelength of a light source of a stepper (0.248 μm when a KrF excimer laser is used) for transferring patterns. Because the resolution is deteriorated to excess in this situation, it may be improved by a special transfer technique such as RET (Resolution Enhanced Technology).

When such a special transfer technique is used, however, there may occur such a problem that patterns reduce their fidelity while the resolution is improved. In other processes such as an etching process, there may occur another problem that finer patterns cause pattern dimension fluctuations due to density differences. In order to cope with these problems, an OPC (Optical Proximity Effect Correction) which deforms designed layout patterns to obtain desired patterns is widely used (for example, see Japanese Laid-Open Patent Application Nos. 2001-188336 and 2001-100390).

The following are three kinds of well-known specific OPC processes.

(1) Model-Based OPC

This is an OPC process for deforming patterns based on simulation results.

(2) Rule-Based OPC

This is an OPC process for deforming design layout patterns based on specification (OPC rules) set in advance to deform design layout patterns, while considering the diagrammatic features of the design layout patterns, e.g. the width of each pattern, the spacing between adjacent patterns, and the distance from the corner.

(3) Hybrid OPC

This process is a combination of the model-based OPC (1) and the rule-based OPC (2).

The present invention relates to the model-based OPC and the hybrid OPC utilizing the model-based OPC. The model-based OPC will be hereinafter described. The model-based OPC is conventionally performed by considering only the precision of dimensions of the finished patterns without considering requirements such as process fluctuations. According to this process, the dimensions of the finished patterns coincide with the intended dimensions if there are no process fluctuations. However, in the processes for manufacturing semiconductors, process conditions change slightly, depending on devices, materials, environments, level difference on the wafer surfaces, or other reasons. Consequently, when the model-based OPC is actually performed, the finished patterns change their dimensions due to the process fluctuations.

Such fluctuations in the dimensions of the finished patterns lead to decrease in yield. It must be noted that the effects of the process fluctuations to the finished pattern dimensions can be predicted by means of simulation by changing parameters including exposure amounts or defocusing.

Therefore, as shown in FIG. 16, the model-based OPC used in recent years takes not only the dimensional precision but also the process margin into consideration.

A conventional model-based OPC will be described hereinafter with reference to FIGS. 16 and 17A–17D. FIG. 17A shows predicted finished patterns with respect to reference patterns in the case where the OPC is not performed. As apparent from FIG. 17A, when the OPC is not performed, predicted finished patterns 190 and 193 are largely deviated from reference patterns 191 and 192, respectively.

FIG. 17B shows predicted finished patterns with respect to design layout patterns when the model-based OPC for dimension matching is performed so as to grow predicted finished patterns more like the reference patterns. Design layout patterns 195 and 196 are obtained by correcting the reference patterns 191 and 192, respectively. As apparent from FIG. 17B, predicted finished patterns 194 and 197 have been grown more like the reference patterns 191 and 192, respectively.

FIG. 17C shows predicted finished patterns with respect to the design layout patterns when the process fluctuations are taken into consideration in the case where the model-based OPC for dimension matching is performed. As apparent from FIG. 17C, this case suffers the fatal flaw that the left and right finished patterns are united into one finished pattern 198.

FIG. 17D shows design layout patterns in the case where the model-based OPC is performed while taking process fluctuations into consideration in order to avoid such a flaw. As apparent from FIG. 17D, the spacing between design layout patterns 199 and 200 in this case is set wider than the case shown in FIG. 17C by considering the process margin, thereby avoiding the occurrence of the combination of the finished patterns due to the process fluctuations.

A specific method for the conventional model-based OPC in which the process margin is taken into consideration will be described as follows with reference to FIG. 16. FIG. 16 is a flowchart depicting a conventional method for performing the model-based OPC about layout pattern data in metal wiring (see, e.g. FIG. 3).

As shown in FIG. 16, in this model-based OPC, edges which will become correction targets are extracted first and are divided into unit edges to be transferred after the correction (Step S41). This edge division is performed depending on various requirements such as the distances from the apices of the figure, or the relationship with the perpendicular lines from the apices of other figures. Thus layout pattern data after the extraction and division can be obtained (see, e.g. FIG. 4).

Next, finished patterns are predicted by simulation (Step S42), and then a process margin is measured by simulation (Step S43). To be more specific, the amount of distortion between the predicted finished patterns and the reference patterns (design layout patterns before correction) is measured, and the process margin is also measured. Then the results are evaluated (Step S44). If the distortion amount and the process margin fail to reach the respective predetermined reference values (NG), the correction target edges are moved in the direction which denies the distortion or in the direction which increases the process margin (Step S45), and then Steps S42–S44 are performed again.

When the distortion amount and the process margin fail to reach the respective reference values, a series of correcting processes, which involves the prediction of the finished patterns by simulation, the measurement of process margin by simulation and the evaluation of the results, is repeated after the correction target edges have been moved. If the distortion amount and the process margin meet the respective reference values (OK), this correcting procedure is terminated.

If the distortion amount and the process margin do not meet the respective reference values, Steps S42–S45 may be repeated endlessly. To avoid this, the correcting process is generally terminated when the number of repetition exceeds a predetermined upper limit. However, this conventional model-based OPC has such a problem that the correction procedure takes much time, because the series of correcting processes involving the prediction of the finished patterns, the measurement of the process margin, and the transfer of the correction target edges is repeated for each of the target edges.

SUMMARY OF THE INVENTION

The present invention has been developed to solve the above-mentioned conventional problems, and has an object to provide means for improving the rate and precision of the model-based OPC or the hybrid OPC by simulation in which the process margin is taken into consideration.

An apparatus for correcting data of a layout pattern according to the present invention, which has been achieved to solve the above-mentioned problems, includes the following five sections (or means).

The first section extracts a correction target edge (or edges) from the layout pattern (or patterns), and then divides the correction target edge into unit edges to be corrected. The second section sets lower limits and upper limits of movable ranges of the unit edges (or correction target edges). The third section extracts the unit edges (or correction target edges) whose process margins are insufficient by moving the unit edges (or correction target edges) within the movable ranges to perform simulation with process variations. The fourth section newly sets movable ranges where process margins are not insufficient with regard to the unit edges (or correction target edges) whose process margins are insufficient. The fifth section performs a correcting process by a simulation to match a finished dimension of the layout pattern to an intended dimension based on the newly set movable ranges.

According to the apparatus, the correcting process can be performed at a higher precision because the process margins are secured. In addition, the correcting process can be performed at a high rate while securing the process margins, thereby completing the correcting process in a short time while securing a maximum precision in dimension. Thus, a higher rate and a higher precision can be achieved in the model-based OPC or the hybrid OPC by simulation which takes the process margin into consideration.

Hereupon, if the process margins at the lower or upper limits of the movable ranges cannot be secured, auxiliary patterns may be generated to secure the process margins. If so, the process margins can be secured regardless of the edge movable ranges set first, thereby completing the correction with the maximum precision in the finished dimension in a short time within the range where the process margins can be secured.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which.

DETAILED DESCRIPTION OF THE PREFERRED EMBODIMENTS (Embodiment 1)

Hereinafter, Embodiment 1 of the present invention will be described.

Figure 1:
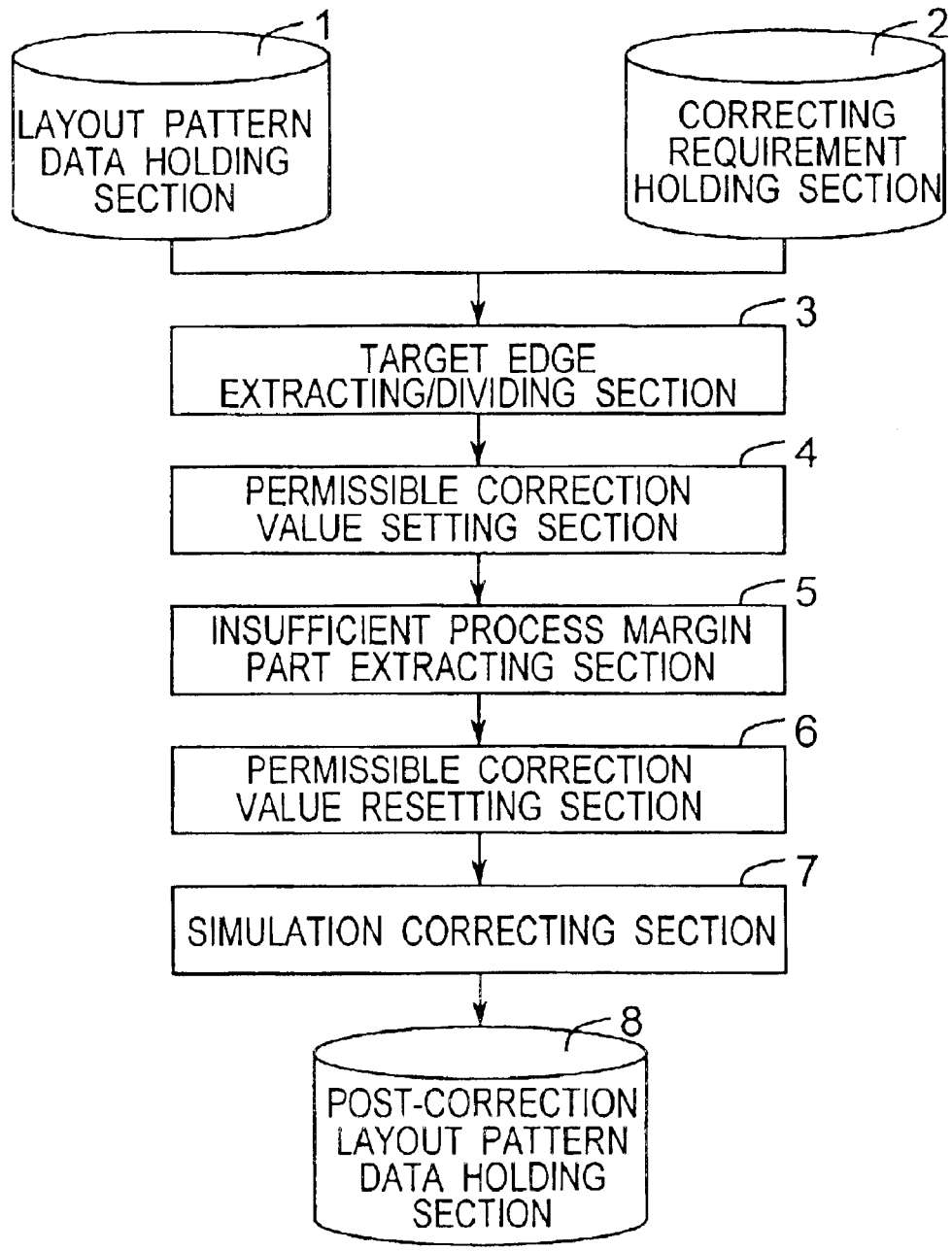
FIG. 1 is a block diagram of an apparatus for correcting layout pattern data according to the present invention.

FIG. 1 is a block diagram showing a rough construction of an apparatus for correcting layout pattern data according to the present invention. As shown in FIG. 1, the apparatus for correcting the layout pattern data includes a layout pattern data holding section 1, a correcting requirement holding section 2, a target edge extracting/dividing unit 3, a permissible correction value setting section 4, an insufficient process margin part extracting section 5, a permissible correction value resetting section 6, a simulation correcting section 7, and a post-correction layout pattern data holding unit 8. The apparatus, which is not illustrated in detail, is composed of a computer system in which programs for executing correction are stored in a recording medium such as a hard disk.

The layout pattern data holding section 1 holds layout pattern data. The correcting requirement holding section 2 holds files which contain requirements to execute the correction (extracting/dividing requirements for target edges to be corrected, optical requirements, the number of simulations, reference values of distortion amount, reference values of process margins, and the like). The target edge extracting/dividing section 3 extracts and divides correction target edges. The permissible correction value setting section 4 sets movable ranges for the correction target edges.

The insufficient process margin part extracting section 5 extracts the correction target edges whose process margins are insufficient. The permissible correction value resetting section 6 sets movable ranges which newly secure the process margins for the correction target edges whose process margins are insufficient. The simulation correcting section 7 performs the correction by simulation, based on the set movable ranges (permissible correction range). The post-correction layout pattern data holding section 8 holds corrected layout pattern data.

Figure 2:
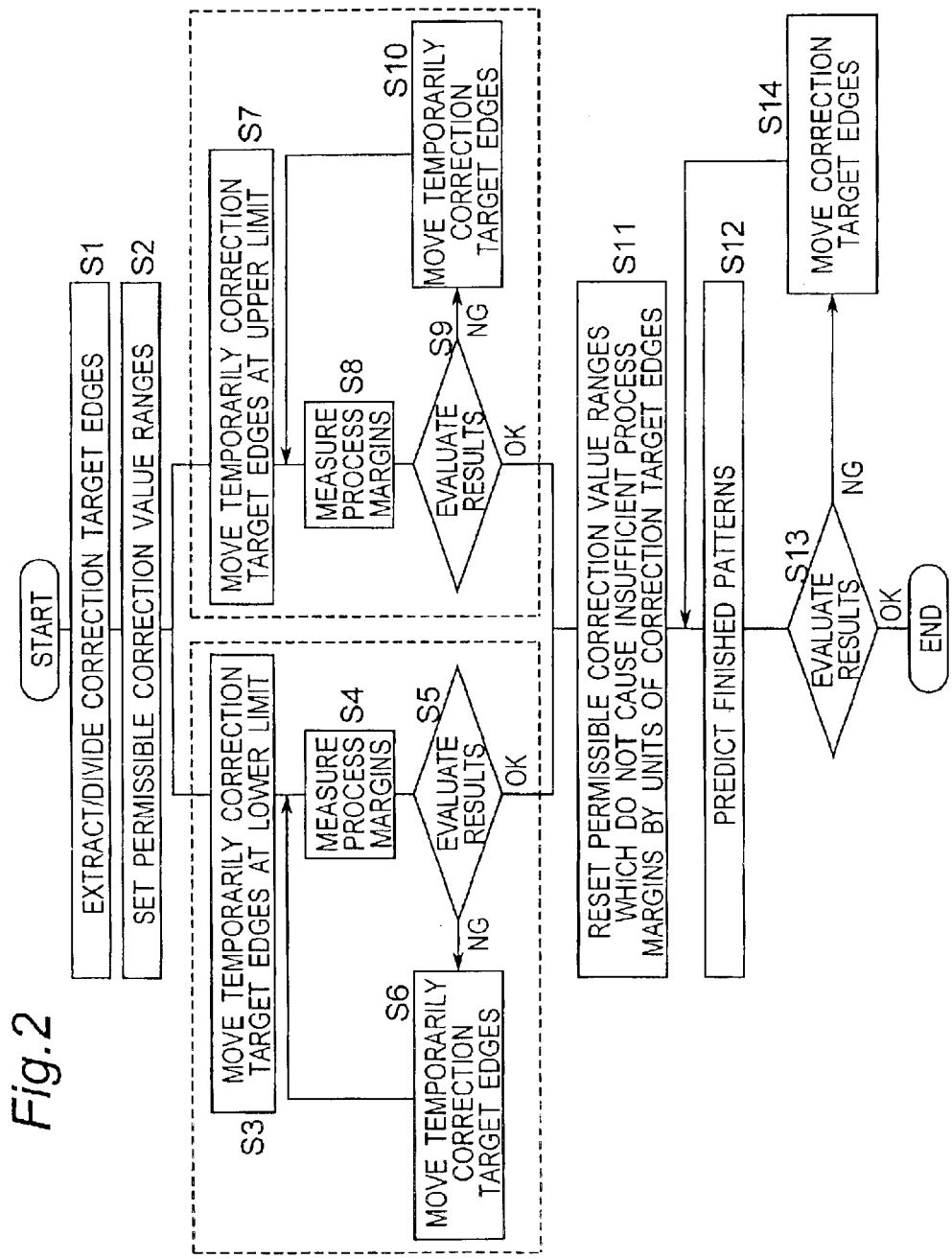
FIG. 2 is a flowchart showing a method of correcting the layout pattern data according to Embodiment 1 of the present invention.
Figure 3:
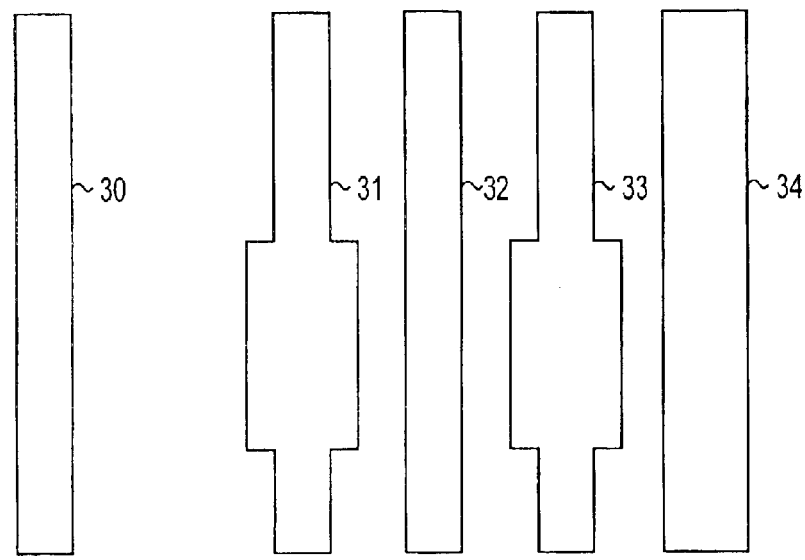
FIG. 3 is an illustration depicting the layout pattern data of metallic wiring.
Figure 4:
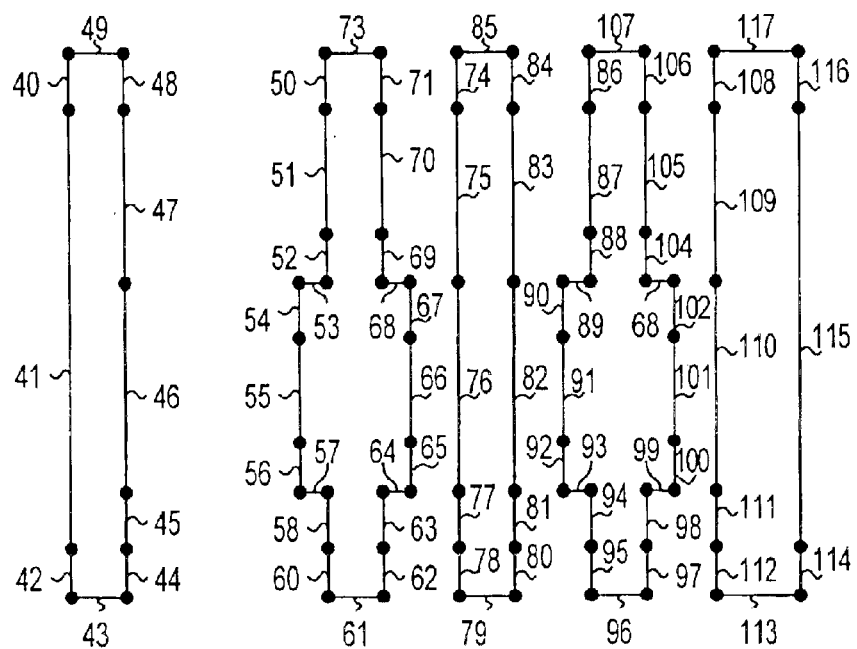
FIG. 4 is an illustration depicting the layout pattern data after dividing correction target edges into unit edges.
Figure 16:
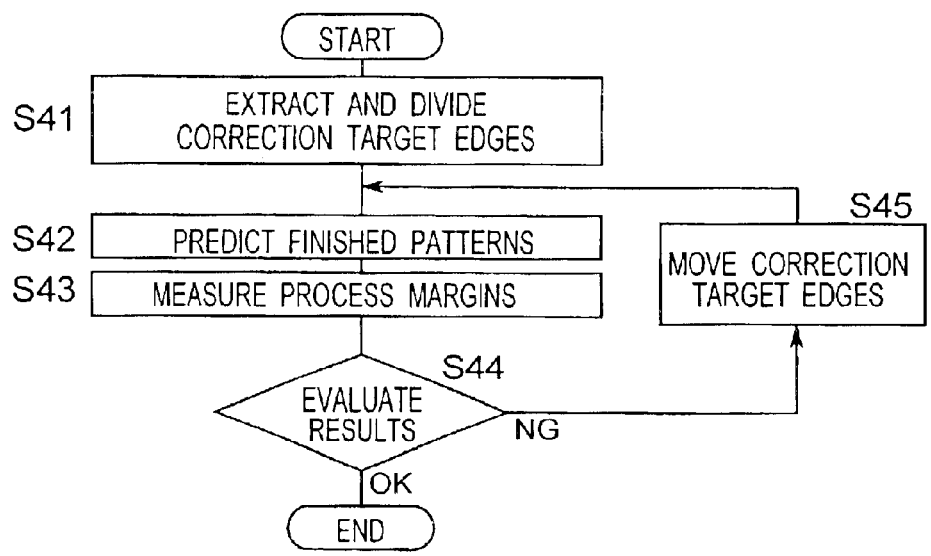
FIG. 16 is a flowchart depicting a conventional method of correcting layout pattern data.
Figure 17A:
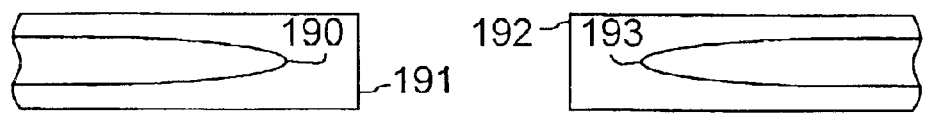
FIGS. 17A–17D are illustrations showing design layout patterns and corresponding finished layout patterns.
Figure 17B:
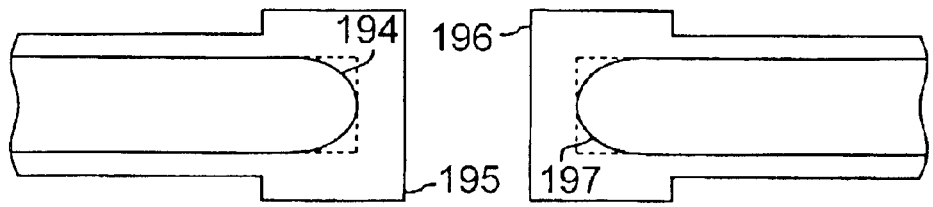
Figure 17C:
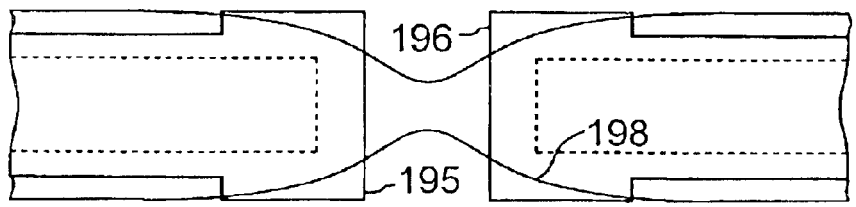
Figure 17D:
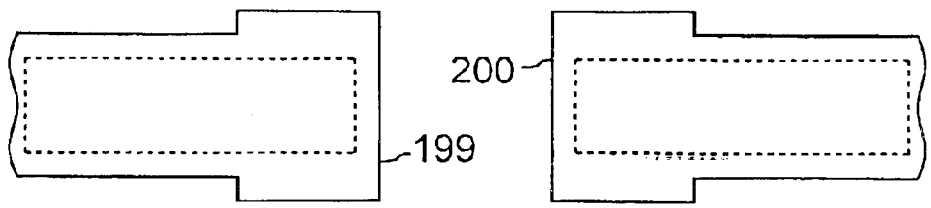

The behavior of the apparatus for correcting the layout pattern data or a method of correcting the layout pattern data shown in FIG. 1 will be described while referring to a flowchart shown in FIG. 2. As shown in FIG. 2, in the apparatus or method for correcting the layout pattern data, the correction target edges are extracted and divided in Step S1. To be more specific, the edges, which are to be correction targets at first, are extracted with respect to the layout pattern data in the metal wiring composed of patterns 30 to 34 as shown in FIG. 3. As shown in FIG. 4, the correction target edges are divided into edges 40–117 (unit edges or edge units) which are to be moved by the correction. The process in Step S1 is substantially as same as the process in step S41 in the conventional method of correcting the layout pattern data shown in FIG. 16.

In Step S2, the permissible correction value is set. That is, the movable range x of the edges to be moved by the correction is set. The movable range x has a lower limit (lower limit value) of a1 (a minimum value) and an upper limit (upper limit value) of b1 (a maximum value).

$$a1 \leq x \leq b1$$

a1: lower limit
b1: upper limit

After Step 2 has been executed, Steps S3–S6 using the lower limit a1 and Steps S7–S10 using the upper limit b1 are executed. Hereupon, Steps S3–S6 and Steps S7–S10, which can be processed independently from each other, are executed by parallel processing such as CPU distribution.

Figure 5:
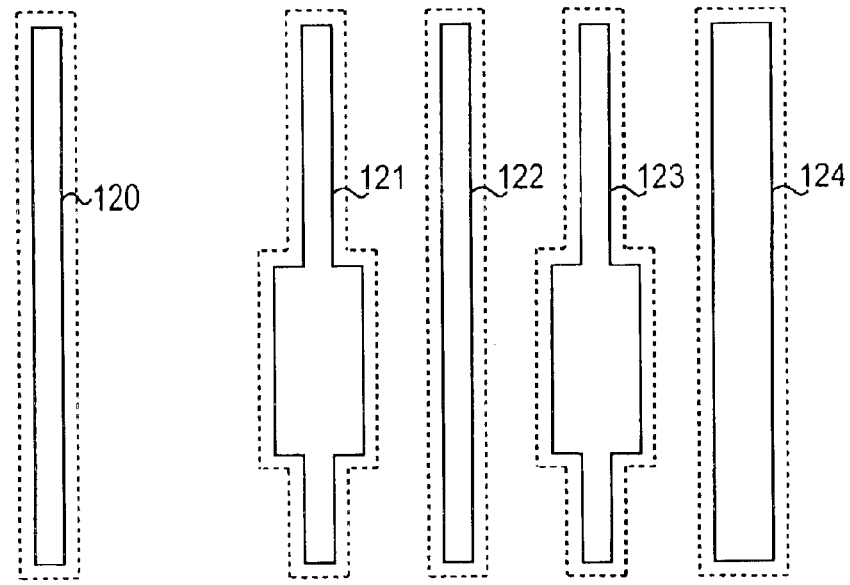
FIG. 5 is an illustration depicting the layout pattern data after performing sizing at a lower limit.

The processes in Steps S3–S6 utilizing the lower limit a1 will be described as follows. In this case, first of all, at Step S3, the correction target edges 120–124 are temporarily moved to have the lower limit a1 in the movable range as shown in FIG. 5. Then in Step S4, the process margins are measured by the simulation which takes process fluctuations into consideration. In Step S5, the results are evaluated (or judged).

Figure 6:
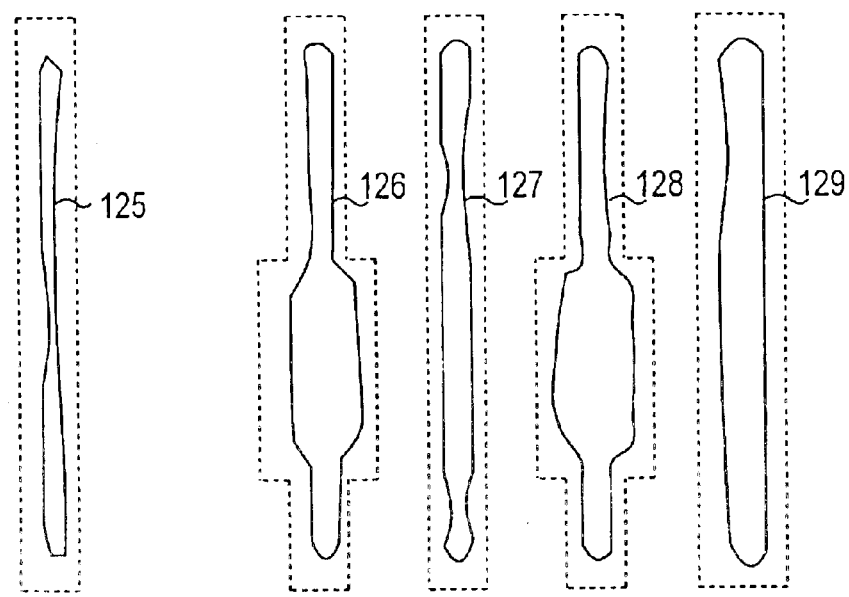
FIG. 6 is an illustration depicting predicted finished patterns after performing simulation of process fluctuations.

FIG. 6 shows the results of predicted finished patterns 125–129 obtained by performing the simulation which takes process fluctuations into consideration. As apparent from FIG. 6, the predicted finished pattern 125 becomes extremely narrow due to the process fluctuations. Thus the evaluation (or judgement) in Step S5 turns out to be NG.

Figure 7:
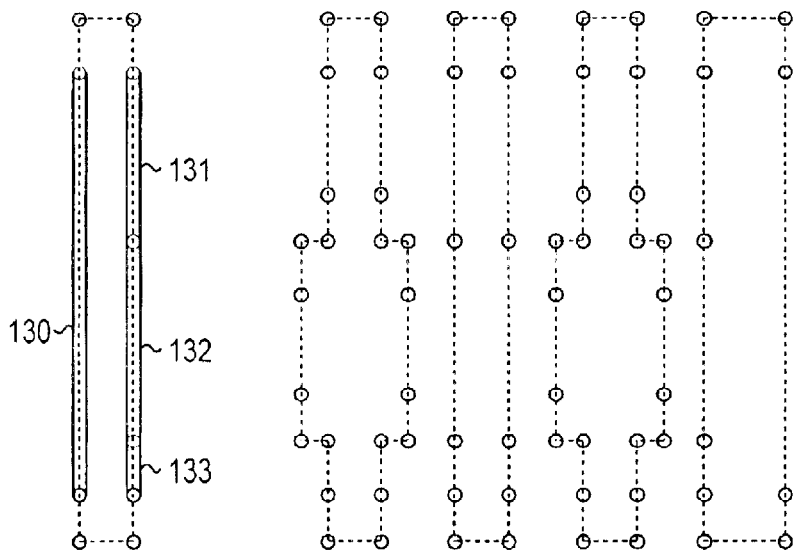
FIG. 7 is an illustration depicting results of extraction of the correction target edges whose process margins are insufficient.

In this case, as shown in FIG. 7, edges 130–133 are extracted as correction target edges whose process margins are insufficient.

In Step S6, the edges whose process margins are insufficient are temporarily moved in the direction which increases the process margins. Then, Steps S4–S5 are executed again, that is, the process margins are measured again to evaluate the results. The edges, which have been found to have sufficient process margins by the first measurement of process margin and the result determination, are secured to have sufficient process margins even after being moved to the lower limit a1, making it unnecessary to temporarily move these edges in the direction which increases the process margins. Therefore, hereafter, the temporary movement of these edges and the measurement of the process margins are not performed.

The above-mentioned process is repeated until the process margin is secured. It must be noted that if the process margins do not meet the reference values, Steps S4–S6 are repeated endlessly, so the process is terminated in the same manner as in the prior art when the number of repetitions exceeds a predetermined upper limit. In such a case, the process could be suspended as an error.

Figure 8:
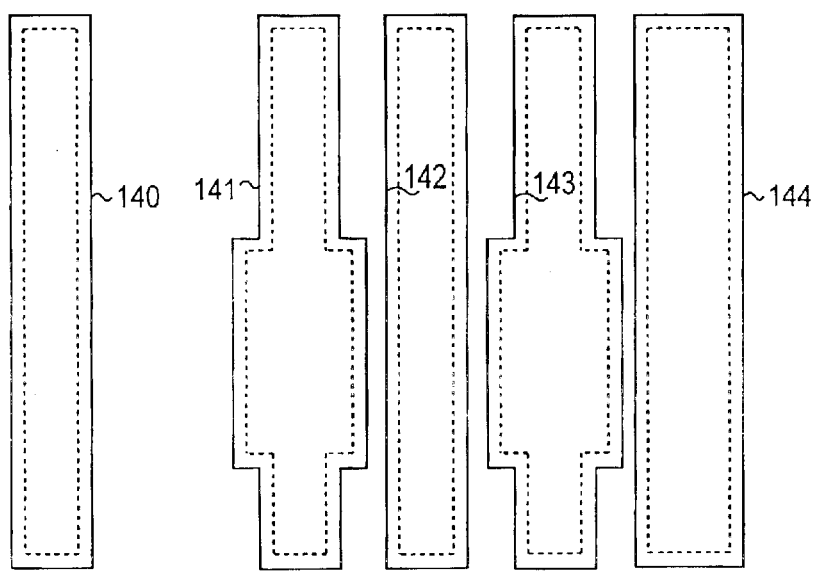
FIG. 8 is an illustration depicting the layout pattern data after performing sizing at an upper limit.

The processes in Steps S7–S10 utilizing the upper limit b1 will be described as follows. In this case, at Step S7, correction target edges 140–144 are temporarily moved to have the upper limit b1 in the movable range as shown in FIG. 8. In Step S8, the process margins are measured by the simulation which takes process variations into consideration. In Step S9, the results are evaluated.

Figure 9:
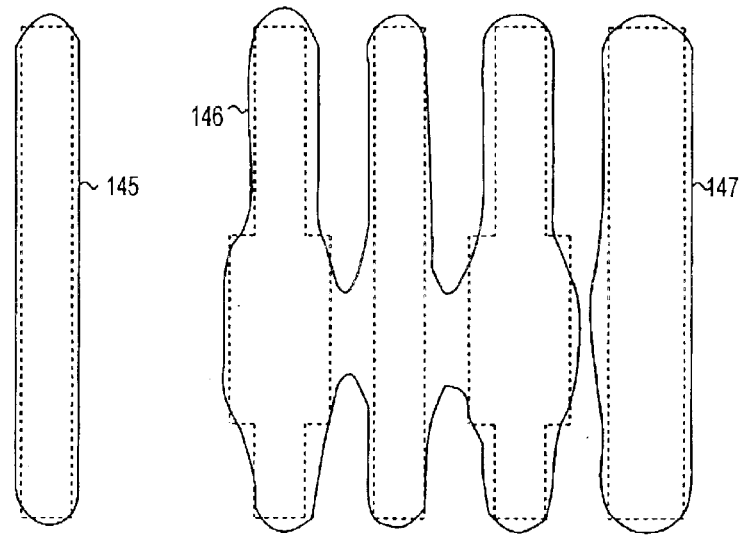
FIG. 9 is an illustration depicting predicted finished pattern after performing simulation of process fluctuations.

FIG. 9 shows the results of predicted finished patterns 145–147 by performing the simulation which takes process fluctuations into consideration. As apparent from FIG. 9, the predicted finished pattern 146 is a combination of three predicted finished patterns which should be separated from each other. Consequently, at Step S9, the result turn out be NG.

Figure 10:
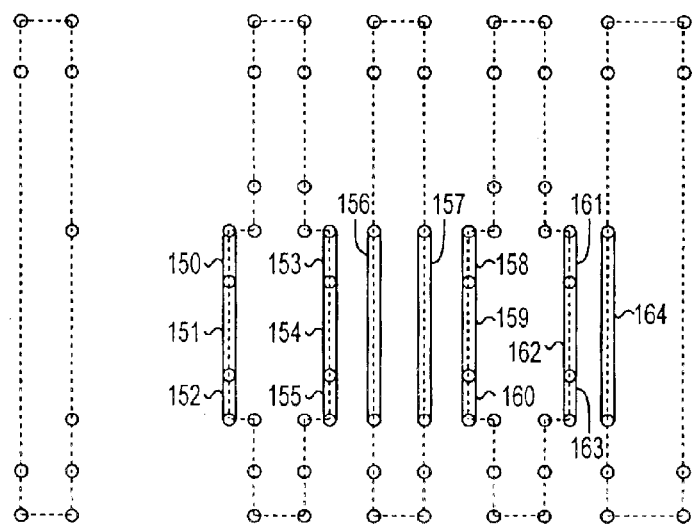
FIG. 10 is an illustration depicting results of extraction of the correction target edges whose process margins are insufficient.

In this case, as shown in FIG. 10, edges 150–164 are extracted as correction target edges whose process margins are insufficient.

In Step S10, the edges whose process margins are insufficient are temporarily moved in the direction that increases the process margins. Then, Steps S8–S9 are executed again, that is, the process margins are measured again to evaluate the results. The edges, which have been found to have sufficient process margins by the first measurement of process margin and the result evaluation, are secured to have sufficient process margins even after being moved to the upper limit b1, making it unnecessary to temporarily move these edges in the direction which increases the process margins. Therefore, hereinafter, the temporary movement of these unit edges and the measurement of the process margins are not performed.

The above-mentioned process is repeated until the process margins are secured. It must be noted that if the process margins do not meet the reference values, Steps S8–S10 are repeated endlessly, so the process is terminated when the number of repetitions exceeds a predetermined upper limit. In such a case, the process could be suspended as an error.

After Steps S3–S6 and Steps S7–S10 have been executed in parallel in this manner, in step S11, an edge movable range (a permissible correction value) of the edges whose process margins are not insufficient is reset in units of correction target edges. To be more specific, the movable range for the correction target edges which can meet the reference values of process margin is reset for each correction target edge, based on the positions of the correction target edges with secured process margins in Steps S3–S6 and Steps S7–S10.

Table 1 shows an example of the reset ranges of the correction target edges.

TABLE 1

Resetting of the movable range of correction target edges

| Correction target<br>edge numbers | Movable range x of<br>correction target edges |
|---|---|
| 130 | a2 ≦ x ≦ b1 |
| 131, 132, 133 | a3 ≦ x ≦ b1 |
| 150, 151, 152 | a1 ≦ x ≦ b2 |
| 153, 155, 158, 160, 161, 163 | a1 ≦ x ≦ b3 |
| 154, 159, 162 | a1 ≦ x ≦ b4 |
| 156, 157 | a1 ≦ x ≦ b5 |
| 164 | a1 ≦ x ≦ b6 |
| Others | a1 ≦ x ≦ b2 | a1: the lower limit
b1: the upper limit

In Step S12, within the reset movable range of the correction target edges which can secure the process margins, an OPC for finished dimension matching is performed by simulation to the predict finished layout patterns. In Step S13, the results are evaluated. For example, the amount of distortion between the predicted finished patterns and the reference patterns is measured to evaluate whether the distortion amount meets the predetermined reference value. If the distortion amount fails to reach the predetermined reference value (NG), the correction target edges are moved in the direction which denies the distortion, and then Steps S12–S13 are performed again.

To be more specific, when the distortion amount fails to meet the reference value, a series of correcting processes, which involves the prediction of the finished patterns by simulation and the determination of the results, is repeated after the correction target edges have been moved. If the distortion amount meets the reference value (OK), this correcting procedure is terminated.

Figure 11:
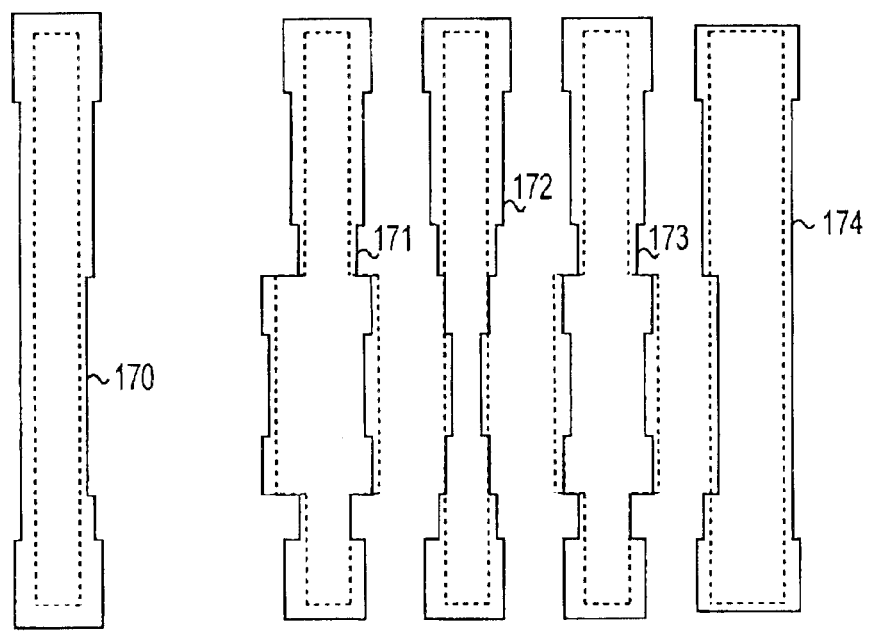
FIG. 11 is an illustration depicting corrected layout pattern data.

FIG. 11 shows corrected layout patterns 170–174 obtained by such a correcting process.

According to the apparatus or method for correcting layout pattern data of Embodiment 1 (hereinafter referred to as the correcting method of Embodiment 1), the rate of the correcting process can be increased. The reason for this is as follows. In either of the conventional apparatus for or method of the correcting layout pattern data (hereinafter referred to as the conventional correcting method) or the correcting method of Embodiment 1, the prediction of the finished patterns and the measurement of the process margins demand the largest process time. These processes take time because of the simulation processes involving complicated optical calculations or function fitting.

With regard to the correcting method of Embodiment 1 and the conventional correcting method, the number of measurements of the process margin and the number of the predictions of finished patterns are compared. For example, the case where the number of repetitions reaches A is considered.

According to the correcting method of Embodiment 1, for example in the case shown in FIG. 4, the number of divided edges to be the correction targets is 76 extending from 40 to 117 (59 and 72 absent). Therefore, the number of predictions of the finished patterns with regard to each correction target edge becomes (76×A). This number (76×A) is the same as the number of the conventional correcting method.

Next, the number of measurement of process margin is considered. In the conventional correcting method, the measurement of process margin is conducted for each correction target edge, so the number of measurement of process margin becomes (76×A).

In contrast, in the correcting method of Embodiment 1, the measurement of process margin is performed in Steps S3–S6 and Steps S7–S10 in the flowchart shown in FIG. 2. Steps S7–S10, which have more edges whose process margins are insufficient, have the rate-limiting of the process time.

In Steps S7–S10, the measurement of process margin is performed with regard to all of the 76 correction target edges only one time, and after that, it is performed only for the 15 edges 150–164 whose process margins are insufficient (or absent). Hence, the number of measuring the process margin becomes (76+15×(A−1)).

For example, when the number of times of repetition A is 10, the number of measuring the process margin comes to 760 times in the conventional correcting method, whereas the number of measuring the process margin accounts to 211 times in the correcting method of Embodiment 1. Therefore, in the correcting method of Embodiment 1, the number of measuring process margin can be largely reduced as compared with the conventional correcting method, thereby increasing the rate and precision of the correcting process.

As described hereinbefore, according to the apparatus or method for correcting layout pattern data of Embodiment 1, the correcting process can be performed at higher precision because process margin is secured. In addition, the correcting process can be performed at high rate while securing process margin, thereby completing the correcting process in a short time while securing the maximum dimension precision. Thus high rate and high precision can be achieved in the model-based OPC or the hybrid OPC utilizing the model-based OPC by simulation which takes process margin into consideration.

(Embodiment 2)

Hereinafter, Embodiment 2 of the present invention will be described. The apparatus for correcting layout pattern data of Embodiment 2 has substantially the same hardware configuration as the apparatus for correcting the layout pattern data according to Embodiment 1 shown in FIG. 1. However, the functions of the apparatus for correcting the layout pattern data or the method of correcting the layout pattern data are different from the case of Embodiment 1 in the following aspects.

When the correcting method of Embodiment 1 is employed, there are cases where process margin cannot be secured because correction cannot be performed over the movable range of the correction target edges set first. Therefore, in the apparatus or method for correcting layout pattern data of Embodiment 2 (hereinafter referred to as the correction method of Embodiment 2), the process margin is secured by generating (adding) auxiliary patterns.

Figure 12:
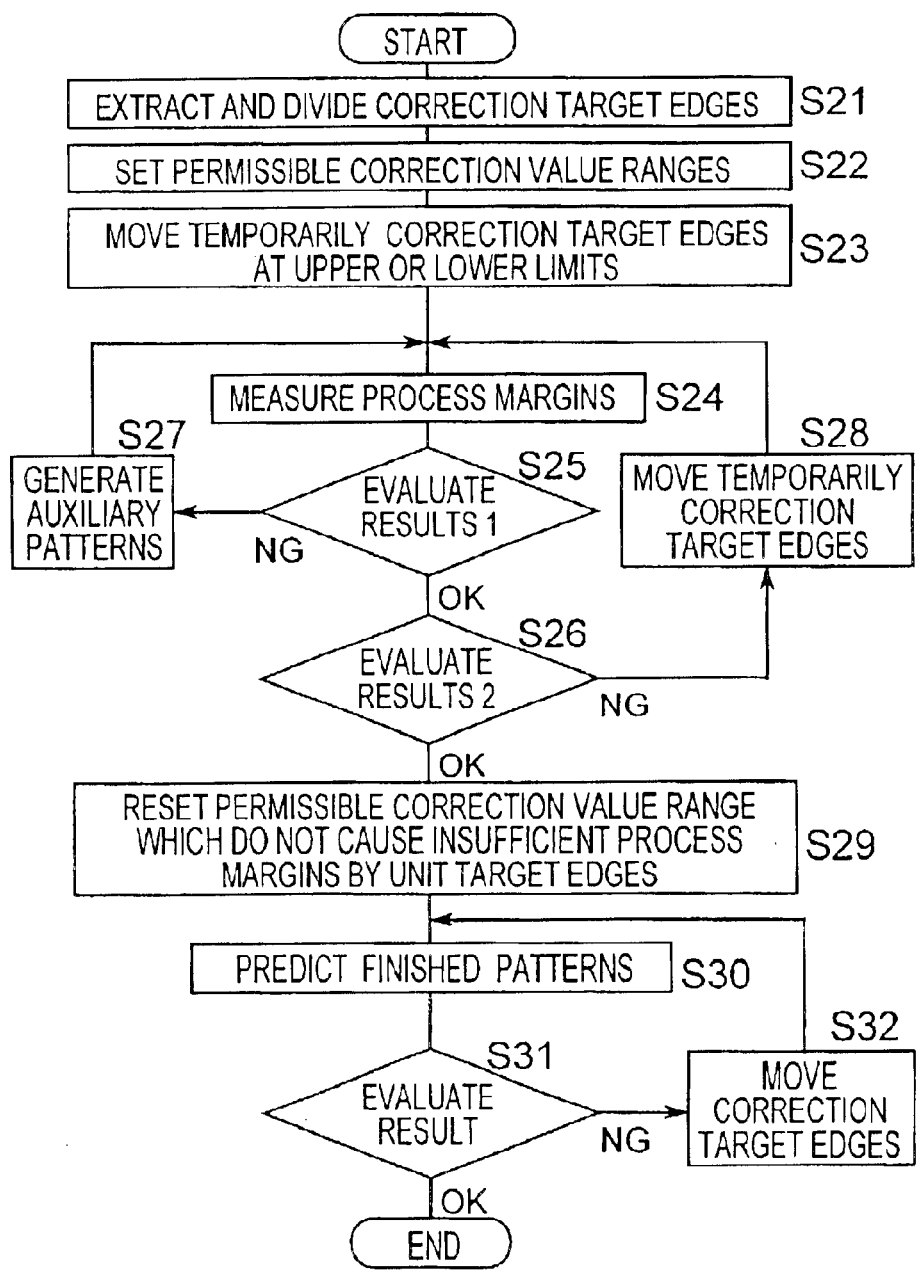
FIG. 12 is a flowchart showing a method of correcting layout pattern data according to Embodiment 2 of the present invention.

FIG. 12 is a flowchart depicting the correction method of Embodiment 2. The following is a specific description of the correction method of Embodiment 2 with reference to FIG. 12. The correction method of Embodiment 2 greatly differs from the correction method of Embodiment 1 in that after the measurement of process margin, it is determined whether process margin can be secured within the set movable range of edges and that when it is impossible to secure process margin, auxiliary patterns are generated (added).

As shown in FIG. 12, according to the correction process of Embodiment 2, in Steps S21–S22, correction target edges are extracted and divided, and an edge movable range (a maximum permissible correction value) is set basically in the same manner as the correction method of Embodiment 1 (Steps S1–S2 shown in FIG. 2). The movable range x set first for all correction target edges is as follows.

a1≦x≦c1 a1: lower limit
c1: upper limit

Hereupon, the upper limit c1 is set at a value smaller than the upper limit b1 of Embodiment 1.

In Step S23, the correction target edges are temporarily moved at the correction upper limit value or the correction lower limit value. In other words, the correction target edges are temporarily moved so as to have the lower limit value a1 or the upper limit c1 in the edge movable range. In Step S24, the process margins are measured by simulation which takes process variations into consideration. In Step S25, the results are evaluated.

Figure 13:
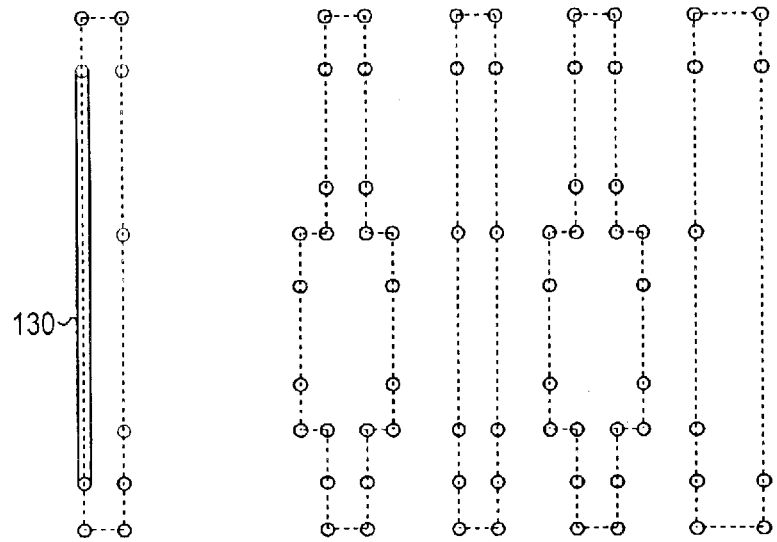
FIG. 13 is an illustration depicting results of extraction of correction target edges whose process margins are insufficient.

When process margin is measured in this manner, there may be a correction target edge which cannot secure process margin even at the upper limit c1, like the correction target edge 130 shown in FIG. 13. In this case, the evaluation in Step S25 turns out to be NG.

Figure 14:
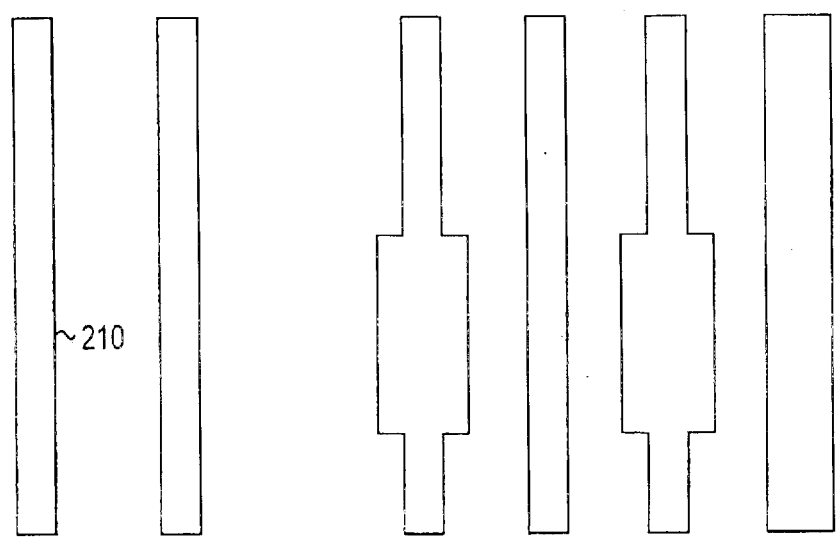
FIG. 14 is an illustration depicting the layout pattern data after generating auxiliary patterns.

When the evaluation in Step S25 turns out to be NG, in Step S27 an auxiliary pattern 210 is generated as shown in FIG. 14 so as to secure the process margin within the set movable range. Since the spacing between the correction target edge 130 and the auxiliary pattern 210 becomes short (they get closer to each other) in this case, the correction target edge 130 can secure its process margin within the movable range.

When the evaluation at Step S25 turns out to be OK, the results of the process margin measurement in Step S24 are evaluated in Step S26. If the evaluation in Step S26 turns out to be NG, then in Step S28, the correction target edges whose process margins are insufficient can be temporarily moved in the direction which increases the process margin. Then, Steps S24–S26 are executed again. In other words, the process margins are measured again and the results are evaluated. The edges, which have been found to have sufficient process margins by the first measurement of process margin and the result evaluation, do not have to be temporarily moved in the direction which increases the process margins. Therefore, hereinafter the temporary movement of these edges and the measurement of the process margins are not performed.

The above-mentioned correction process is repeated until the process margin is secured. It must be noted that if the process margins do not meet the reference values, Steps S24–S26 and S28 are repeated endlessly, so the process is terminated when the number of repetitions exceeds a predetermined upper limit value. In such a case, the process could be suspended as an error.

When the evaluation in Step S26 turns out to be OK, in Step S29, an edge movable range (a maximum permissible correction value) of the edges whose process margins are not insufficient is reset in units of correction target edges. To be more specific, the movable range for the correction target edges which can meet the reference values of the process margin is reset for each correction target edge, based on the positions of the correction target edges with the secured process margins.

In Step S30, within the reset movable range of the correction target edges which can secure the reset process margin, the OPC for finished dimension matching is performed by simulation to predict the finished layout patterns. In Step S31, the results are evaluated. For example, the amount of distortion between the predicted finished patterns and the reference patterns is measured to determine whether the distortion amount meets the predetermined reference value. If the distortion amount fails to reach the predetermined reference value (NG), the correcting target edges are moved in the direction which denies the distortion at Step 32, and then Steps S30–S31 are performed again.

To be more specific, when the distortion amount fails to meet the reference value, a series of correcting processes, which involves the prediction of the finished patterns by simulation and the determination of the results, is repeated after the correction target edges have been moved. If the distortion amount meets the reference value (OK), this correcting procedure is terminated.

Figure 15:
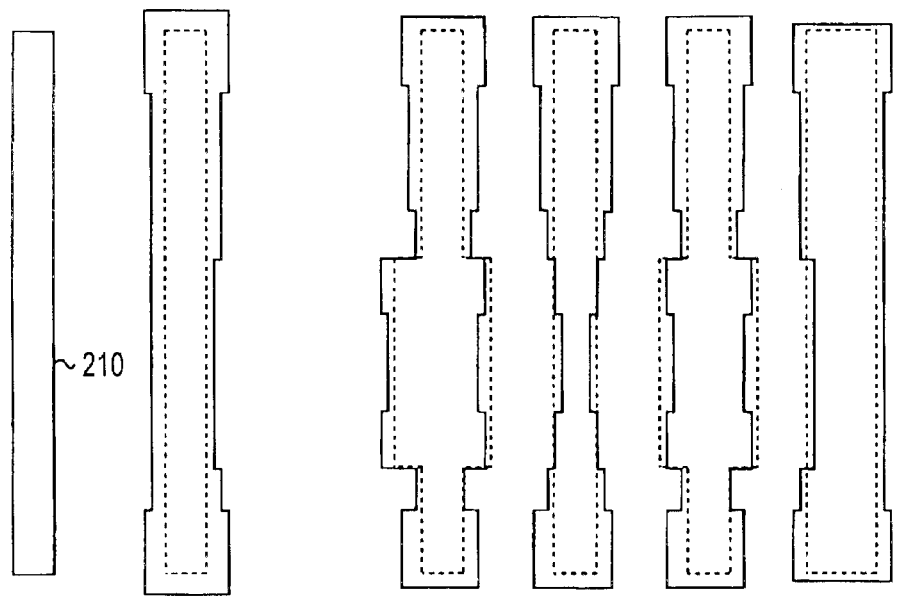
FIG. 15 is an illustration depicting corrected layout pattern data.

FIG. 15 shows the layout patterns obtained as the result of this correction.

As described hereinbefore, according to the apparatus or method for correcting the layout pattern data according to Embodiment 2, the precision of the correcting process can be increased because the process margin is secured in the same manner as in Embodiment 1. In addition, the correcting process can be performed at high rate while securing process margin, thereby completing the correcting process in a short time while securing the maximum dimension precision. Thus high rate and high precision can be achieved in the model-based OPC or the hybrid OPC utilizing the model-based OPC by simulation which takes process margin into consideration.

Furthermore, when there are correction target edges which cannot secure process margin, auxiliary patterns are generated so as to secure the process margin within the set movable range. Hence, process margin can be secured regardless of the edge movable range set first, thereby completing the correction with the maximum precision in finished dimensions in a short time within the range where process margin can be secured.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for correcting data of a layout pattern, comprising:

an edge extracting/dividing section which extracts a correction target edge from said layout pattern and divides said correction target edge into unit edges to be corrected;

a permissible correction range setting section which sets lower limits and upper limits of movable ranges of said unit edges;

an insufficient process margin part extracting section which extracts said unit edges whose process margins are insufficient by moving said unit edges within the movable ranges to perform simulation with process variations;

a permissible correction range resetting section which newly sets movable ranges where process margins are not insufficient with regard to said unit edges whose process margins are insufficient; and a simulation correcting section which performs a correcting process by simulation to match a finished dimension of said layout pattern to an intended dimension based on the newly set movable ranges.

2. The apparatus according to claim 1, wherein when said insufficient process margin part extracting section cannot secure the process margins at the lower or upper limits of the movable ranges, said extracting section generates auxiliary patterns to secure the process margins.

* * * * *